United States Patent
Chou

(10) Patent No.: US 6,618,301 B2
(45) Date of Patent: Sep. 9, 2003

(54) MODULAR MEMORY STRUCTURE HAVING ADAPTABLE REDUNDANCY CIRCUITRY

(75) Inventor: Jonathan Y. P. Chou, Taipei Hsien (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/989,425

(22) Filed: Nov. 21, 2001

(65) Prior Publication Data

US 2003/0002364 A1 Jan. 2, 2003

(30) Foreign Application Priority Data

Jun. 27, 2001 (TW) ........................................ 90115581 A

(51) Int. Cl.[7] .............................................. G11C 29/00
(52) U.S. Cl. ................ 365/200; 365/225.7; 365/230.03
(58) Field of Search ............................... 365/200, 225.7, 365/230.03

(56) References Cited

U.S. PATENT DOCUMENTS 5,487,039 A * 1/1996 Sukegawa .................... 365/200
5,991,211 A * 11/1999 Kato et al. ................... 365/200
6,411,556 B1 * 6/2002 Amano ........................ 365/200

* cited by examiner

Primary Examiner—Huan Hoang
(74) Attorney, Agent, or Firm—Birch, Stewart, Kolasch & Birch, LLP

(57) ABSTRACT

The invention provides a modular memory structure having adaptable redundancy circuitry, which can repair different types of defects using an addressing line and an enabled line, thereby increasing the yield of the memory device. The modular memory structure having adaptable redundancy circuitry includes: a plurality of main memory blocks to store data; a plurality of redundancy memory blocks to replace the defective memory blocks; a plurality of fuse sets to generate replacement signals by programming the plurality of fuse sets to replace the defect memory positions on the main memory blocks with the corresponding redundancy memory blocks.

8 Claims, 3 Drawing Sheets

MODULAR MEMORY STRUCTURE HAVING ADAPTABLE REDUNDANCY CIRCUITRY

BACKGROUND OF THE INVENTION

1. Field of the Invention

This invention relates to a memory structure, and particularly to a modular memory structure having adaptable redundancy circuitry, which uses an enabled line to reduce the fuses required by a programming redundancy circuit and determines the optimized replacement range of defective memory to avoid memory resource waste during the early development phase.

2. Description of the Related Art

In a semiconductor memory device, for example, in a dynamic random access memory (DRAM) or a static random access memory (SRAM) module, redundancy circuitry is widely used. FIG. 1 is a block diagram of a typical memory block, including redundancy circuitry. As shown in FIG. 1, during the verification of each and every cell on the chip before shipping, in the event of data stored into the memory array 16 through the port 12 and the interface 14 encountering defective cells in the memory array 16, redundancy cells 18 are commonly used to replace defective cells produced by the manufacturing process, thereby increasing the yield. Following the increment of memory density, a hierarchical decoding (not shown) scheme, e.g. top, middle, and bottom addressing, is employed in order to further increase the operating speed and reduce the switching power of decoding operation in DRAM and SRAM. Redundancy replacement is activated where a single row of memory cells or column of memory cells with defects is replaced with a redundancy row or column 18 by making the fuses connect or blow, i.e., programming, to map failure addresses (not shown). However, the number of fuses becomes prohibitively large for this conventional redundancy scheme, particularly in high-density memory, in which a lot of room is consumed by thousands of fuses, so that normal memory cells are compressed into a limited space and the implementation of the circuitry becomes overly complicated.

SUMMARY OF THE INVENTION

Therefore, an object of the invention is to provide a modular memory structure having adaptable redundancy circuitry, which can repair different types of defects to increase the yield of the memory device.

A further object of the invention is to provide a modular memory structure having adaptable redundancy circuitry, which uses an addressing line and an enabled line to reduce the required fuse sets and avoid memory resource waste.

To realize the above and other objects, the invention provides a modular memory structure having adaptable redundancy circuitry, which can repair different types of defects by using an addressing line and an enabled line, thereby increasing the yield of the memory device. The modular memory structure having adaptable redundancy circuitry includes: a plurality of main memory blocks for storing data; a plurality of redundancy memory blocks for replacing the defect memory blocks; a plurality of fuse sets to generate replacement signals by programming the plurality of fuse sets to replace the defect memory positions on the main memory blocks with the corresponding redundancy memory blocks. The replacement signals include an MAT replacement signal, a memory sector replacement signal, and a memory row and column replacement signal. Thus, the optimized replacement range is defined by the signals with the sizes of MAT, sector, and row or column.

BRIEF DESCRIPTION OF THE DRAWINGS

The invention will become apparent by referring to the following detailed description of a preferred embodiment with reference to the accompanying drawings, wherein.

DETAILED DESCRIPTION OF THE INVENTION

Figure 1:
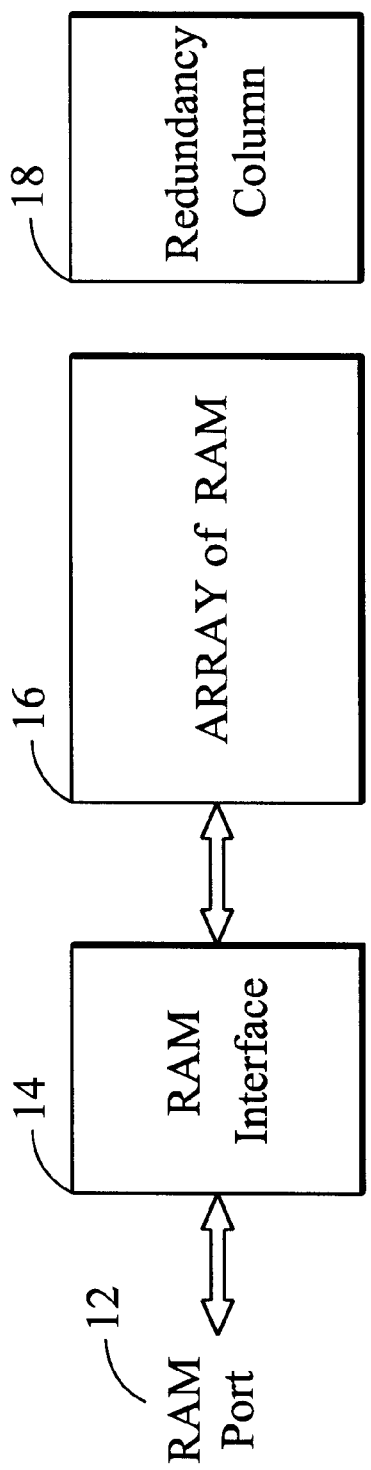
FIG. 1 is a block diagram of a typical memory including redundancy circuitry.
Figure 2:
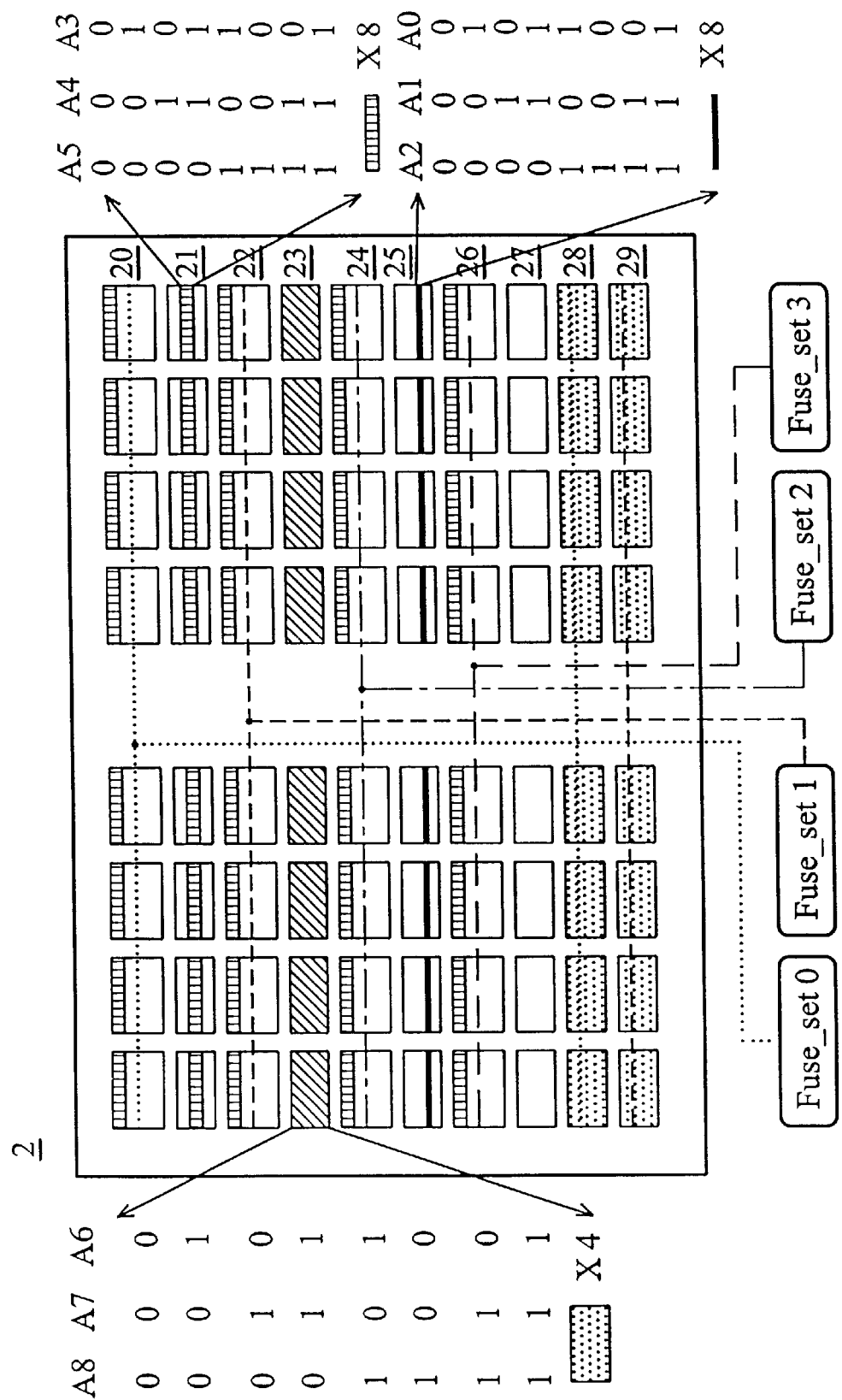
FIG. 2 is a block diagram of a modular memory structure with adaptable redundancy circuitry of the invention.

FIG. 2 is a block diagram of a modular memory structure 2 with adaptable redundancy circuitry of the invention. In FIG. 2, the structure includes main memory blocks 21, 23, 25, and 27 for storing data; redundancy memory blocks 20, 22, 24, 26, 28, and 29 for replacing the defect positions on the main memory blocks 21, 23, 25, and 27; and fuse sets $Fuse_{13}$ set 0, $Fuse_{13}$ set 1, $Fuse_{13}$ set 2, and $Fuse_{13}$ set 3 for choosing the replacement sizes. The replacement sizes include a redundancy cell, a column or a row, a sector, and an MAT. As shown in FIG. 2, the implementation of one main memory with respect to one redundancy memory plus two additional redundancy memory blocks forms the body of the memory module 2. For example, every four sectors form an MAT and two MATs are arranged in a line. Thus, a redundancy memory line is interlaced with a main memory line from line 20 to line 27. In addition, two additional redundancy memory blocks 28, 29 follow to form the memory structure 2 as shown in FIG. 2. Moreover, the memory module 2 is electrically connected to fuse sets $Fuse_{13}$ set 0, $Fuse_{13}$ set 1, $Fuse_{13}$ set 2, and $Fuse_{13}$ set 3 to complete the implementation. Fuse_set 0 is electrically connected to the redundancy memory line 20 and the left half of the redundancy memory line 28. $Fuse_{13}$ set 1 is electrically connected to the redundancy memory line 22 and the left half of the redundancy memory line 29. $Fuse_{13}$ set 2 is electrically connected to the redundancy memory line 24 and the right half of the redundancy memory line 28. $Fuse_{13}$ set 3 is electrically connected to the redundancy memory line 26 and the right half of the redundancy memory line 29. The adaptable redundancy circuitry is further described as follows.

Figure 3:
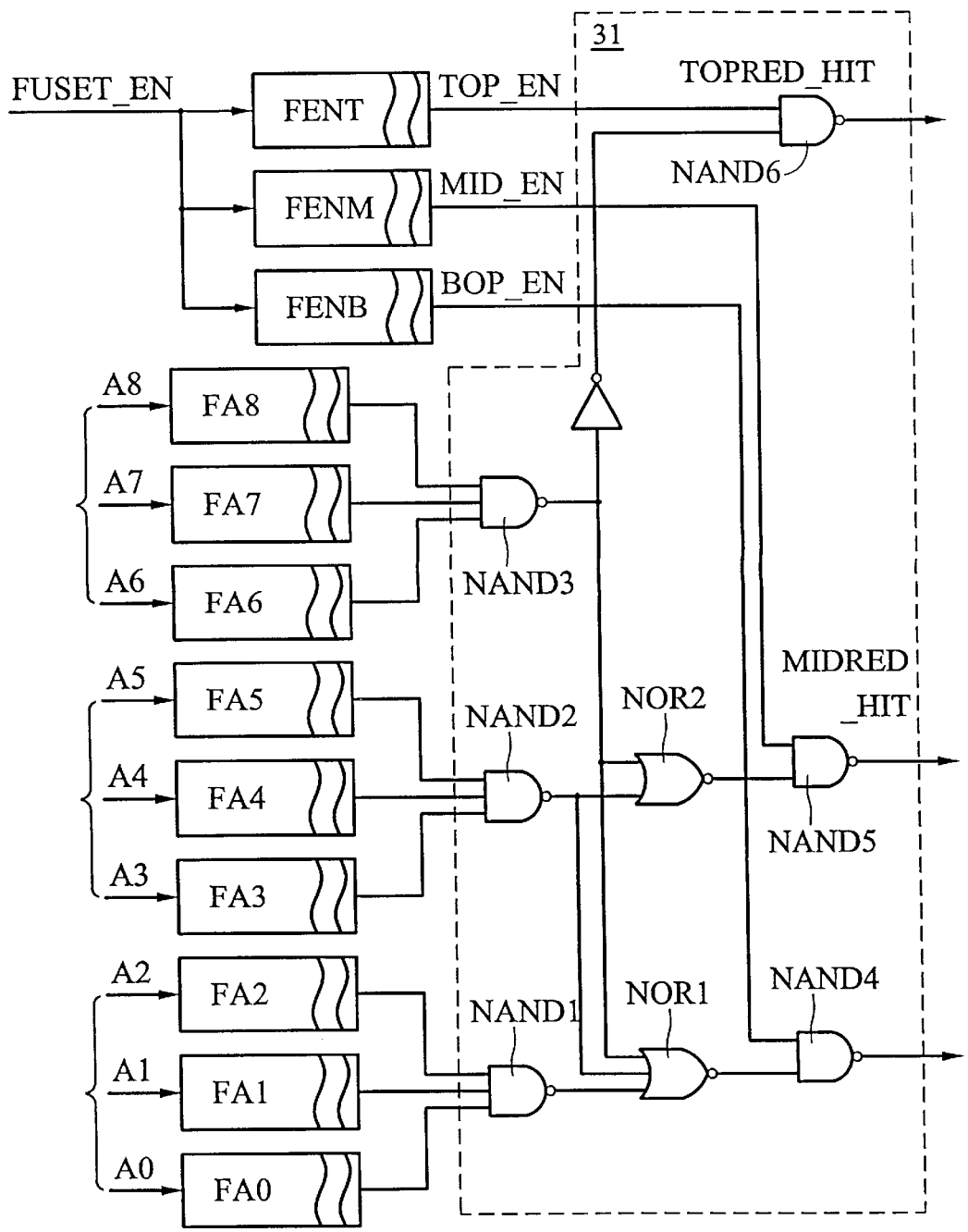
FIG. 3 is a schematic diagram of an adaptable redundancy circuitry of the invention.

FIG. 3 is a schematic diagram of an adaptable redundancy circuitry of the invention. In FIG. 3, the circuitry includes a plurality of fuse-added elements FA0–FA8; a plurality of enable fuse elements FENT, FENM, and FENB; a replacement signal generation circuitry 31. As shown in FIG. 3, defect addresses A0–A8 are respectively input to fuse-added elements FA0–FA8 so as to have the programming function. A column or row is decoded by the bottom hierarchy addresses A0–A2 through the fuse-added elements FA0–FA2. The outputs of the elements FA0–FA2 are input to the NAND gate NAND1 of the replacement signal generation circuitry 31. A sector is decoded by the middle hierarchy addresses A3–A5 through the fuse-added elements FA3–FA5. The outputs of the elements FA3–FA5 are input to the NAND gate NAND2 of the replacement signal generation circuitry 31. A MAT is decoded by the top hierarchy addresses A6–A8 through the fuse-added elements FA6–FA8. The outputs of the elements FA6–FA8 are input to the NAND gate NAND3 of the replacement signal generation circuitry 31. In this example, each fuse-added element has a distance of 5 μm. A fuse set enable signal FUSET$_{13}$ EN is concurrently input to the enable fuse elements FENT, FENM, FENB to be programmed, respectively, so as to generate the corresponding enable signals TOP$_{13}$ EN, MID$_{13}$ EN, and BOT$_{13}$ EN respectively input to the replacement signal generation circuitry 31. The replacement signal generation circuitry 31 further includes NAND gates NAND1–NAND6, NOR gates NOR1 and NOR2, and an inverter NOT. The NAND gate NAND1 receives the output signal from the fuse-added elements FA0–FA2 and generates an output signal to the NOR gate NOR1. The NAND gate NAND2 receives the output signal from the fuse-added elements FA3–FA5 and generates an output signal to the NOR gates NOR1 and NOR2. The NAND gate NAND3 receives the output signal from the fuse-added elements FA6–FA8 and generates a signal N3 to the NOR gate NOR1, NOR2, and the inverter NOT. The NOR gate NOR1 receives the output signal from the NAND gates NAND1, NAND2, and NAND3 and generates an output signal to the NAND gate NAND4. The NOR gate NOR2 receives the output signal from the NAND gates NAND2 and NAND3 and generates an output signal to the NAND gate NAND5. The inverter NOT receives an output signal from the NAND gate NAND3 and generates an inverted phase output signal to the NAND gate NAND6. The NAND gate NAND4 receives signal BOT$_{13}$ EN and the output of the NOR gate NOR1 to generate the replacement signal BOTRED$_{13}$ HIT to determine the defect range replaced with a column or a row. The NAND gate NAND5 receives signal MID$_{13}$ EN and the output of the NOR gate NOR2 to generate the replacement signal MIDRED$_{13}$ HIT to determine the defect range replaced with a sector. The NAND gate NAND6 receives signal TOP$_{13}$ EN and the output of the inverter NOT to generate the replacement signal TOPRED$_{13}$ HIT to determine the defect range replaced with an MAT. In such a structure, the replacement signals BOTRED$_{13}$ HIT, MIDRED$_{13}$ HIT and TOPRED$_{13}$ HIT can indicate a replacement size of the defect memory and replace it with an optimized range by means of the structure of FIG. 2, thereby reducing the required fuses and avoiding wasted space.

Although the invention has been described in its preferred embodiment, it is not intended to limit the invention to the precise embodiment disclosed herein. Those who are skilled in this technology can still make various alterations and modifications without departing from the scope and spirit of this invention. Therefore, the scope of the invention shall be defined and protected by the following claims and their equivalents.

What is claimed is:

1. A modular memory structure having adaptable redundancy circuitry, comprising:

a plurality of main memory blocks to store data;

a plurality of redundancy memory blocks to replace a defective memory block in the plurality of main memory blocks;

a plurality of fuse sets to be programmed to generate replacement signals for the replacement of the defective memory block's positions on the plurality of main memory blocks with the plurality of corresponding redundancy memory blocks, wherein the plurality of fuse sets further comprises:

a plurality of fuse-added elements to be programmed according to a fuse set enable signal input externally to generate the enable signals to enable respective defect memory replacement ranges; and replacement generation circuitry to receive and decode the output of the plurality of fuse-added elements and the enable signals of the plurality of enable fuse elements to determine a replacement signal for the replacement range of defective memory block with the redundancy memory block.

2. The modular memory structure of claim 1, wherein the defect memory replacement ranges comprise a bit replacement, a line replacement, a sector replacement and an MAT replacement.

3. The modular memory structure of claim 1, wherein the replacement signal comprises an MAT replacement signal, a sector replacement signal and a line replacement signal.

4. The modular memory structure of claim 1, wherein the line replacement signal is a column replacement signal.

5. The modular memory structure of claim 2, wherein the line replacement signal is a row replacement signal.

6. The modular memory structure of claim 1, wherein the enable signals comprise an MAT enable signal, a sector enable signal and a line enable signal.

7. The modular memory structure of claim 6, wherein the line enable signal is a column enable signal.

8. The modular memory structure of claim 6, wherein the line enable signal is a row enable signal.

* * * * *